United States Patent
Zhou

(10) Patent No.: US 11,972,953 B2
(45) Date of Patent: Apr. 30, 2024

(54) SEMICONDUCTOR STRUCTURE AND MANUFACTURING METHOD THEREOF

(71) Applicant: Changxin Memory Technologies, Inc., Anhui (CN)

(72) Inventor: Zhen Zhou, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 184 days.

(21) Appl. No.: 17/396,695

(22) Filed: Aug. 7, 2021

(65) Prior Publication Data

US 2021/0366719 A1 Nov. 25, 2021

Related U.S. Application Data

(63) Continuation of application No. PCT/CN2020/130380, filed on Nov. 20, 2020.

(30) Foreign Application Priority Data

Apr. 30, 2020 (CN) .......................... 202010361178.4

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0332* (2013.01); *H01L 21/0337* (2013.01);
(Continued)

(58) Field of Classification Search
None
See application file for complete search history.

(56) References Cited

U.S. PATENT DOCUMENTS

| 9,012,330 B2 | 4/2015 | Nair et al. |
| 10,553,433 B2 | 2/2020 | Shih |

(Continued)

FOREIGN PATENT DOCUMENTS

| CN | 104425218 A | 3/2015 |
| CN | 207352356 U | 5/2018 |

(Continued)

OTHER PUBLICATIONS

PCT International Preliminary Report on Patentability dated Nov. 10, 2022, issued in related International Application No. PCT/CN2020/130380, with English translation (13 pages).
(Continued)

*Primary Examiner* — Jiong-Ping Lu
(74) *Attorney, Agent, or Firm* — Sheppard Mullin Richter & Hampton LLP

(57) ABSTRACT

A semiconductor structure and a manufacturing method thereof are provided. The method includes: providing a substrate; forming, on the substrate, a first mask layer having a plurality of strip-shaped first patterns arranged in parallel; forming, on the first mask layer, a second mask layer having a plurality of strip-shaped second patterns arranged in parallel; forming, on the second mask layer, a third mask layer having a plurality of strip-shaped third patterns arranged in parallel, the second patterns overlap with the third patterns, and the second patterns and the third patterns are configured to sever the first patterns at predetermined positions; and performing layer-by-layer etching, using the first mask layer, the second mask layer, and the third mask layer as masks to transfer the first patterns, the second patterns, and the third patterns to the substrate to form an array of discrete active areas.

12 Claims, 9 Drawing Sheets

(51) Int. Cl.
  *H01L 21/311* (2006.01)
  *H01L 21/3213* (2006.01)
  *H10B 12/00* (2023.01)
  *H01L 27/02* (2006.01)

(52) U.S. Cl.
  CPC .. *H01L 21/31144* (2013.01); *H01L 21/32139* (2013.01); *H10B 12/00* (2023.02); *H10B 12/01* (2023.02); *H10B 12/02* (2023.02); *H01L 21/3081* (2013.01); *H01L 27/0207* (2013.01); *H10B 12/482* (2023.02); *H10B 12/488* (2023.02)

(56) References Cited

U.S. PATENT DOCUMENTS

| | | | | |
|---|---|---|---|---|
| 2002/0172901 | A1* | 11/2002 | Tokushima | G03F 7/70466 430/394 |
| 2006/0273456 | A1* | 12/2006 | Sant | H01L 21/3088 257/734 |
| 2013/0157441 | A1* | 6/2013 | Han | H10B 99/00 257/E21.09 |
| 2019/0139767 | A1* | 5/2019 | Shih | H01L 21/0338 |
| 2019/0139964 | A1 | 5/2019 | Varghese et al. | |
| 2020/0043733 | A1 | 2/2020 | Chang et al. | |

FOREIGN PATENT DOCUMENTS

| | | |
|---|---|---|
| CN | 109767977 A | 5/2019 |
| CN | 110707005 A | 1/2020 |
| KR | 2009-0071047 A | 7/2009 |

OTHER PUBLICATIONS

Extended European Search Report dated Aug. 22, 2022, issued in related European Patent Application No. 20933278.2 (9 pages).
First Search dated May 16, 2023, issued in related Chinese Application No. 202010361178.4 (7 pages).
PCT International Search Report and the Written Opinion dated Feb. 20, 2021, issued in related International Application No. PCT/CN2020/130380 (9 pages).

* cited by examiner

SEMICONDUCTOR STRUCTURE AND MANUFACTURING METHOD THEREOF

CROSS-REFERENCE TO RELATED APPLICATIONS

This application is a continuation application of International Patent Application No.: PCT/CN2020/130380, filed on Nov. 20, 2020, which claims priority to Chinese Patent Application No.: 202010361178.4, filed on Apr. 30, 2020. The above-referenced applications are incorporated herein by reference in their entirety.

TECHNICAL FIELD

The present invention relates to the field of semiconductor technologies, and specifically, to a semiconductor structure and a manufacturing method thereof.

BACKGROUND

Dynamic random-access memories are semiconductor memories widely used in modern intelligent systems. As the feature size of a semiconductor integrated circuit continues to decrease, the critical dimension of the dynamic random-access memory gradually approaches the physical limit of optical photolithography, which poses a severe challenge to semiconductor manufacturing technology.

A storage unit in a memory storage array is formed on an active area. As the storage density increases, the size of the active area becomes smaller. Due to the limitation of technologies such as photolithography and etching, it is becoming more difficult to form the active area array. Therefore, forming the array of small-sized discrete active areas by using semiconductor technology to improve the yield of memories is an urgent technical problem to be resolved.

SUMMARY

The objective of the present invention is to provide a semiconductor structure and a manufacturing method thereof, to alleviate the problems in the existing process of manufacturing the array of small-sized discrete active areas.

One aspect of the present invention is directed to a semiconductor structure manufacturing method. The method may include: providing a substrate; forming a first mask layer on the substrate, the first mask layer having a plurality of strip-shaped first patterns arranged in parallel and configured to form a plurality of strip-shaped continuous active areas arranged in parallel in the substrate; forming a second mask layer on the first mask layer, the second mask layer having a plurality of strip-shaped second patterns arranged in parallel; forming a third mask layer on the second mask layer, the third mask layer having a plurality of strip-shaped third patterns arranged in parallel and overlapping the second patterns, wherein the second patterns and the third patterns are configured to sever the first patterns at predetermined positions; and performing layer-by-layer etching, using the first mask layer, the second mask layer, and the third mask layer as masks, to transfer the first patterns, the second patterns, and the third patterns to the substrate to form an array of discrete active areas.

In some embodiments, forming a second mask layer on the first mask layer may include: forming a first sacrificial layer on the first mask layer, the first sacrificial layer having a plurality of strip-shaped fourth patterns arranged in parallel; forming a mask material on the sidewall of the fourth patterns; and removing the first sacrificial layer while retaining the mask material on the sidewall of the fourth patterns to form the second mask layer.

In some embodiments, forming a third mask layer on the second mask layer may include: forming a second sacrificial layer on the second mask layer, the second mask layer having a plurality of strip-shaped fifth patterns arranged in parallel; forming a mask material on the sidewall of the fifth patterns; and removing the second sacrificial layer while retaining the mask material on the sidewall of the fifth patterns to form the third mask layer.

In some embodiments, the angle between the second patterns and the first patterns may be in a range of 65 degrees to 75 degrees.

In some embodiments, the angle between the second patterns and the third patterns may be 90 degrees.

In some embodiments, the pitch of the fourth patterns may be 4 to 5 times of the pitch of the first patterns, and the pitch of the fifth patterns may be 4 to 5 times of the pitch of the plurality of first patterns.

In some embodiments, the angle between the second patterns and the third patterns may be in a range of 45 degrees to 55 degrees.

In some embodiments, the pitch of the fourth patterns may be 4 to 5 times of the pitch of the first patterns, and the pitch of the fifth patterns may be 3 to 4 times of the pitch of the first patterns.

In some embodiments, the second patterns and the third patterns may be configured to sever the first patterns at predetermined positions by: severing, based on the overlap area of the second patterns and the third patterns, the first patterns.

In some embodiments, the second patterns and the third patterns may be configured to sever the first patterns at predetermined positions by: forming a second complementary mask layer based on the second patterns, the second complementary mask layer having the second complementary patterns covering the area outside the second patterns; forming a third complementary mask layer based on the third patterns, the third complementary mask layer having the third complementary patterns covering the area outside the third patterns; and severing, based on the non-overlapping area of the second complementary patterns and the third complementary patterns, the first patterns.

In some embodiments, the substrate may include an array area. And the first patterns, the second patterns, and the third patterns may be all formed at least in the array area.

In some embodiments, the method may further include: forming a fourth mask layer on the third mask layer. The fourth mask layer may have sixth patterns covering at least a portion of the second patterns and at least a portion of the third patterns at the edge of the array area.

In some embodiments, the sixth patterns may further cover a sub-active area at the end of the continuous active area at the edge of the array area, the sub-active area having a length less than that of the discrete active area. Performing layer-by-layer etching to transfer the first patterns, the second patterns, and the third patterns to the substrate to form an array of discrete active areas may include: transferring, using the first mask layer, the second mask layer, the third mask layer, and the fourth mask layer as masks, the first patterns, the second patterns, the third patterns, and the sixth patterns to the substrate to form the array of discrete active areas. And there may be no sub-active area at the edge of the array area.

In some embodiments, the first patterns may be formed by using a self-aligned double patterning technology.

In some embodiments, the array area may be a storage array area of a dynamic random-access memory.

In some embodiments, the first mask layer, the second mask layer, and the third mask layer may be made of at least one of silicon dioxide, silicon nitride, silicon oxynitride, polycrystalline silicon, monocrystalline silicon, and carbon.

Another aspect of the present invention is directed to a semiconductor structure manufacturing method. The method may include: providing a substrate; forming a first mask layer on the substrate, where a plurality of strip-shaped first patterns arranged in parallel may be formed in the first mask layer, and configured to form a plurality of strip-shaped continuous active areas arranged in parallel in the substrate; forming a second mask layer on the first mask layer, where a plurality of strip-shaped second patterns arranged in parallel may be formed in the second mask layer; forming a third mask layer on the second mask layer, where a plurality of strip-shaped third patterns arranged in parallel may be formed in the third mask layer, the second patterns may overlap with the third patterns, and the second patterns and the third patterns may be configured to cut the first patterns at a predetermined position; and performing layer-by-layer etching, using the first mask layer, the second mask layer, and the third mask layer as masks, to transfer the first patterns, the second patterns, and the third patterns to the substrate to form a plurality of discrete active areas arranged in an array.

In some embodiments, forming a second mask layer on the first mask layer may include: forming a first sacrificial layer on the first mask layer, where a plurality of strip-shaped fourth patterns arranged in parallel may be formed in the first sacrificial layer; and forming a mask material on the sidewall of the fourth patterns, and removing the first sacrificial layer while retaining the mask material on the sidewall of the fourth patterns to form the second mask layer.

In some embodiments, forming a third mask layer on the second mask layer may include: forming a second sacrificial layer on the second mask layer, where a plurality of strip-shaped fifth patterns arranged in parallel may be formed in the second sacrificial layer; and forming a mask material on the sidewall of the fifth patterns, and removing the second sacrificial layer while retaining the mask material on the sidewall of the fifth patterns to form the third mask layer.

In some embodiments, the angle between the second patterns and the first patterns may range from 65 degrees to 75 degrees.

In some embodiments, the angle between the second patterns and the third patterns may be 90 degrees.

In some embodiments, the pitch between the plurality of fourth patterns arranged in parallel may be 4 to 5 times of the pitch between the plurality of first patterns arranged in parallel, and the pitch between the plurality of fifth patterns arranged in parallel may be 4 to 5 times of the pitch between the plurality of first patterns arranged in parallel.

In some embodiments, the angle between the second patterns and the third patterns may range from 45 degrees to 55 degrees.

In some embodiments, the pitch between the plurality of fourth patterns arranged in parallel may be 4 to 5 times of the pitch between the plurality of first patterns arranged in parallel, and the pitch between the plurality of fifth patterns arranged in parallel may be 3 to 4 times of the pitch between the plurality of first patterns arranged in parallel.

In some embodiments, the second patterns and the third patterns may be configured to cut the first patterns at a predetermined position by: cutting the first patterns by using the overlap area of the second patterns and the third patterns.

In some embodiments, the second patterns and the third patterns may be configured to cut the first patterns at a predetermined position by: forming a second complementary mask layer by using the second patterns on the second mask layer, the second complementary patterns including the area outside the second patterns may be formed in the second complementary mask layer; forming a third complementary mask layer by using the third patterns on the third mask layer, the third complementary patterns including the area outside the third patterns may be formed in the third complementary mask layer; and cutting the first patterns by using the non-overlapping area of the second complementary patterns and the third complementary patterns.

In some embodiments, the substrate may include an array area. And the first patterns, the second patterns, and the third patterns may be all formed at least in the array area.

In some embodiments, the method may further include: forming a fourth mask layer on the third mask layer. Sixth patterns may be formed in the fourth mask layer, and the sixth patterns may cover at least a portion of the second patterns and the third patterns at the edge of the array area.

In some embodiments, the sixth patterns may further cover at least a sub-active area of a length less than that of the discrete active area at the end of the continuous active area at the edge of the array area. The first mask layer, the second mask layer, the third mask layer, and the fourth mask layer may be used as masks to transfer the first patterns, the second patterns, the third patterns, and the sixth patterns to the substrate to form the discrete active areas arranged in an array. And there may be no sub-active area at the edge of the array area.

In some embodiments, the first patterns may be formed by using a self-aligned double patterning technology.

In some embodiments, the array area may be a storage array area of a dynamic random-access memory.

In some embodiments, the material of the mask layer may include at least one of silicon dioxide, silicon nitride, silicon oxynitride, polycrystalline silicon, monocrystalline silicon, and carbon.

Another aspect of the present invention is directed to a semiconductor structure. The semiconductor structure may include a semiconductor substrate. The substrate may include an array of discrete active areas. The array of discrete active areas may be formed based on the forgoing semiconductor structure manufacturing method.

The present invention has the following advantages over an existing semiconductor manufacturing technology. In the embodiments of the present invention, a plurality of mask layers may be formed on the surface of a semiconductor substrate based on photolithography patterns of large feature sizes. The patterns in the plurality of mask layers may be properly designed to obtain an array of discrete active areas of small feature sizes by using these mask layers. Therefore, the manufacturing difficulty may be reduced, and the production capacity and yield of semiconductor structures may be improved.

REFERENCE NUMERALS HAVE THE FOLLOWING MEANINGS

Figure 1:
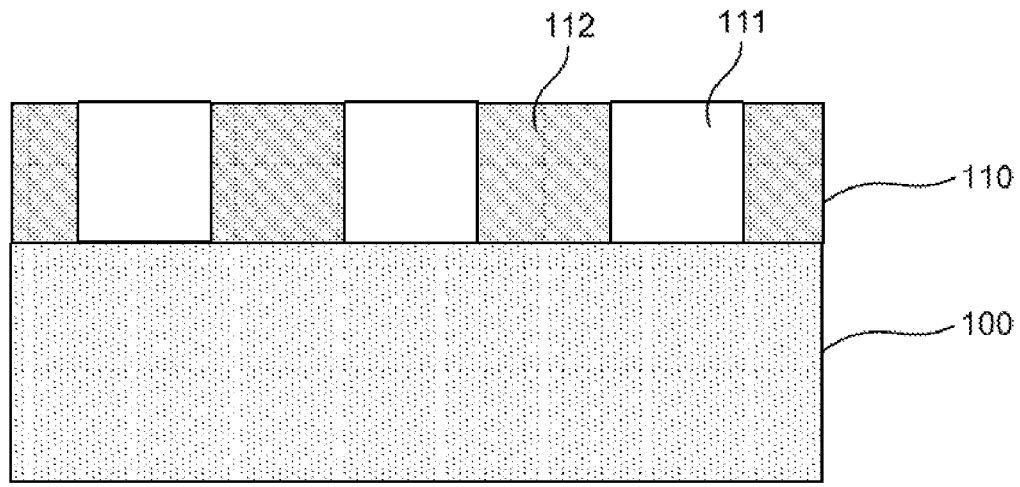
FIGS. 1, 2, 3, 4, 5, 6, 7, 8, 9 and 10 are schematic structural diagrams illustrating the implementations of the semiconductor structure manufacturing methods according to one or more embodiments of the present invention.

A-A1 and B-B1: Directions;
100: Substrate;
110: First mask layer;
120: Second mask layer;
130: Third mask layer;
111: First patterns;
222: Second patterns;
333: Third patterns;
444: Fourth patterns;
555: Fifth patterns;
666: Sixth patterns;
222": Second complementary patterns;
333": Third complementary patterns;
210: First sacrificial layer;
220: Second sacrifice layer;
112: Isolating layer;
223: Isolating layer;
300: Mask material.

DETAILED DESCRIPTION OF THE EMBODIMENTS

The dimensions in the accompanying drawings are illustrative and may not represent the actual scale. Some layers or structures may be omitted in the drawings for the sake of conciseness. FIGS. 1, 2, 3, 4, 5, 6, 7, 8, 9 and 10 are schematic structural diagrams illustrating the implementations of the semiconductor structure manufacturing methods according to one or more embodiments of this invention. FIGS. 11, 12, 13, 14, 15, 16, 17 and 18 are schematic top views illustrating the semiconductor structures according to one or more embodiments of the present invention. The following further describes in detail the semiconductor structure and the manufacturing method thereof provided in the present invention with reference to the accompanying drawings and specific embodiments.

1. The First Embodiment

This invention first presents a semiconductor structure manufacturing method as the first embodiment of this invention.

Referring to FIG. 1, in the first step, a substrate 100 may be provided. A first mask layer 110 may be formed on the surface of the substrate 100. A plurality of strip-shaped first patterns 111 arranged in parallel may be formed in the first mask layer 110 and configured to form a plurality of strip-shaped continuous active areas arranged in parallel in the substrate 100. Three strip-shaped first patterns 111 are schematically depicted in FIG. 1. However, this specification is not limited in this regard, and other numbers of strip-shaped first patterns may be formed in the first mask layer.

Figure 2:
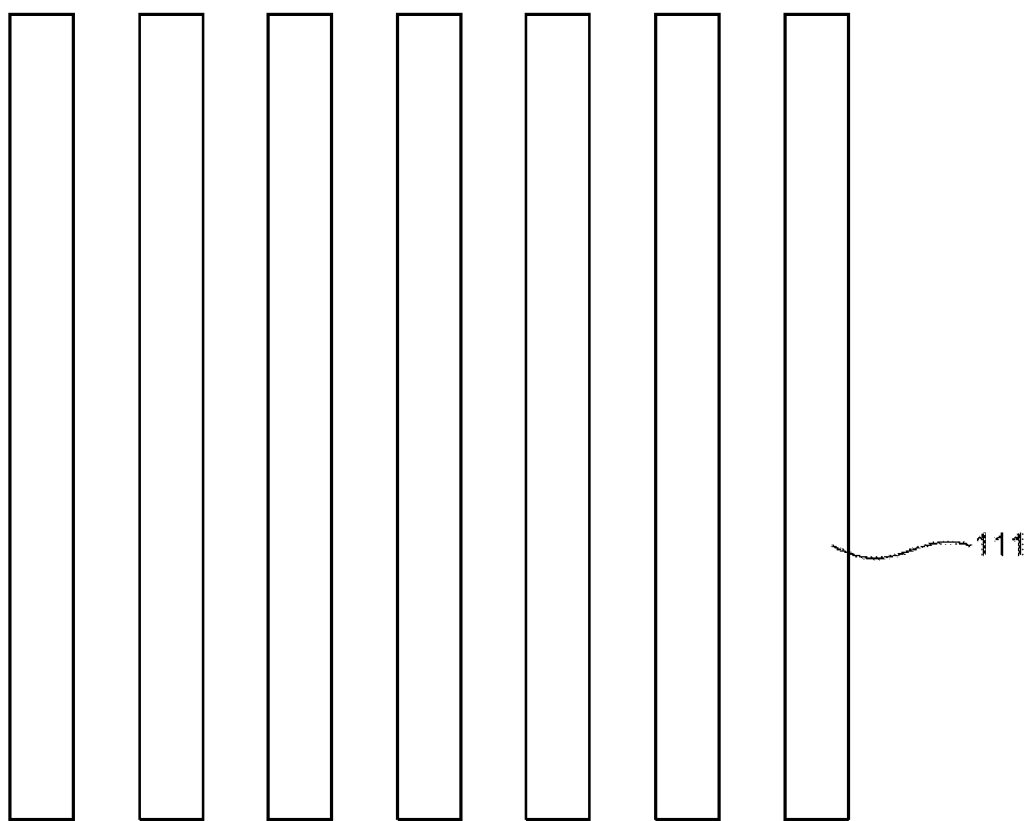

FIG. 2 is a schematic top view illustrating the strip-shaped first patterns 111. Referring to FIG. 2, a plurality of strip-shaped first patterns 111 are schematically depicted to clearly show the structure. The first patterns 111 may be rectangles or curved irregular patterns. A distance between center lines of two adjacent first patterns 111 may be a preset value ACT. In this specification, the distance between center lines of two adjacent patterns (e.g., two adjacent first patterns 111) may also be referred to as the pitch of the patterns.

The first patterns 111 may be formed through one photolithography process or by using a self-aligned double patterning (SADP) technology. A person skilled in the art should understand that the first patterns 111 formed by using the SADP technology may be closed patterns, and every two adjacent first patterns 111 shown in FIG. 2 may be connected together at the upper and lower edges of the first patterns 111. Examples of the connections at the edges are shown at the left and right edges in FIG. 5.

The material of the first patterns 111 in the first mask layer 110 may include at least one of silicon nitride, silicon oxynitride, silicon dioxide, polycrystalline silicon, silicon carbide, silicon carbon nitride, and carbon. An isolation layer 112 may be formed at the position of the first mask layer 110 not occupied by the first patterns 111. The isolation layer 112 may be made of another material different from the material of the first patterns 111. The etching selection ratio of the material of the isolation layer 112 to the material of the first patterns 111 should be high enough for at least one etching or corrosive condition.

The substrate 100 may include, but not limited to, a monocrystalline silicon substrate, a polycrystalline silicon substrate, a gallium nitride substrate, a silicon-on-insulator substrate, or a sapphire substrate.

When the substrate 100 is a monocrystalline silicon substrate or a polycrystalline silicon substrate, the substrate 100 may be an intrinsic silicon substrate or a doped silicon substrate. Further, the substrate 100 may be an N-type or P-type monocrystalline silicon substrate.

Figure 3:
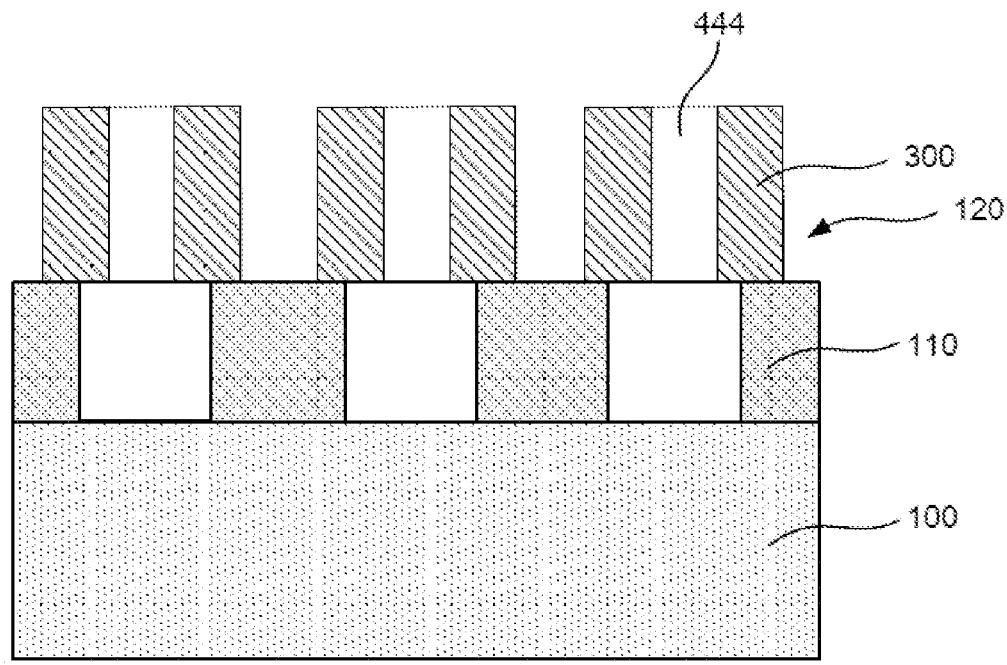
Figure 4:
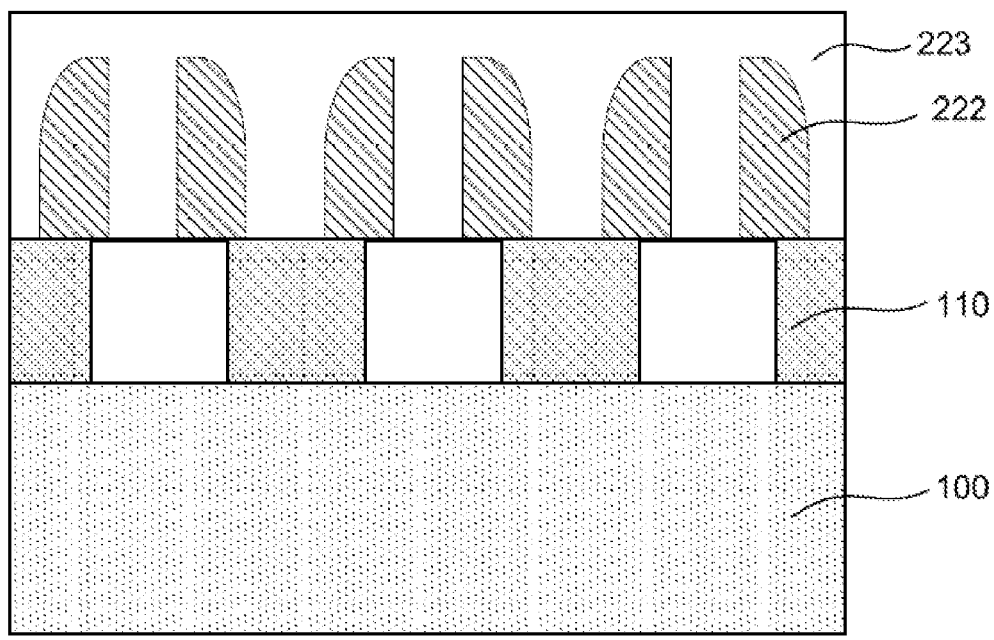

In the second step, referring to FIGS. 3 and 4, a second mask layer 120 may be formed on the first mask layer 110. A plurality of strip-shaped second patterns 222 arranged in parallel may be formed in the second mask layer 120. The number of strip-shaped second patterns 222 may be determined according to actual needs and is not limited in this invention.

The second mask layer 120 may be formed on the first mask layer 110 by depositing a first sacrificial layer 210 on the surface of the first mask layer 110 through a deposition process, as shown in FIG. 3. The first sacrificial layer 210 may be deposited in various manners. For example, the first sacrificial layer 210 with a preset thickness may be deposited on the surface of the first mask layer 110 through chemical vapor deposition. Further, the airflow and temperature may be precisely controlled by controlling the flow rate of the inlet airflow, the volume of the inlet airflow, the deposition duration, and the deposition temperature, or the like. Thus, the first sacrificial layer 210 with a uniform thickness on the surface of the first mask layer 110 may be obtained. The material of the first sacrificial layer 210 may include, but not limited to, silicon dioxide, doped silicon dioxide, silicon nitride, silicon oxynitride, polycrystalline silicon, monocrystalline silicon, carbon.

Figure 14:
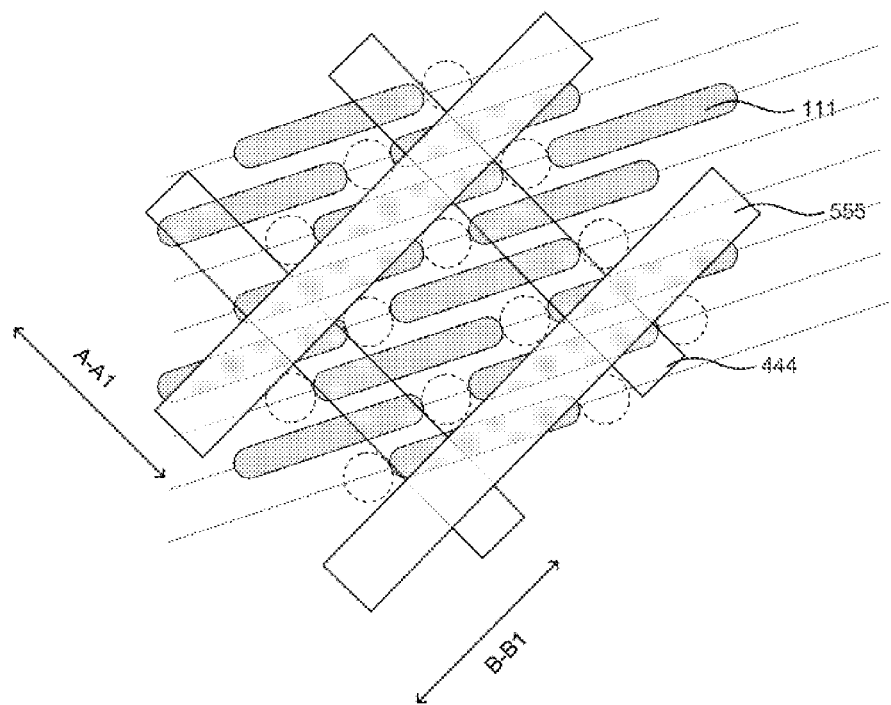

FIG. 14 is a schematic top view illustrating the semiconductor structure in one embodiment of this invention. Referring to FIGS. 3 and 14, a plurality of strip-shaped fourth patterns 444 arranged in parallel may be formed in the first sacrificial layer 210. A mask material 300 may be formed on the sidewall of the fourth patterns 444. The mask material 300 may be directly formed on the sidewall of the fourth patterns 444. Alternatively, the mask material 300 may be first deposited on the entire fourth patterns 444, and then be etched to retain only the mask material 300 on the sidewall of the fourth patterns 444.

Referring to FIG. 4, the plurality of strip-shaped second patterns 222 arranged in parallel in the second mask layer 120 may be formed by removing the first sacrificial layer 210, while retaining the mask material 300 on the sidewall of the fourth patterns 444. A schematic top view illustrating the second patterns 222 is shown in FIG. 5.

The first sacrificial layer 210 may be removed through a wet etching process or a dry etching process. However, an appropriate etchant or corrodent should be selected to avoid causing excessive damage to the mask material on the sidewall when removing the first sacrificial layer 210.

Figure 5:
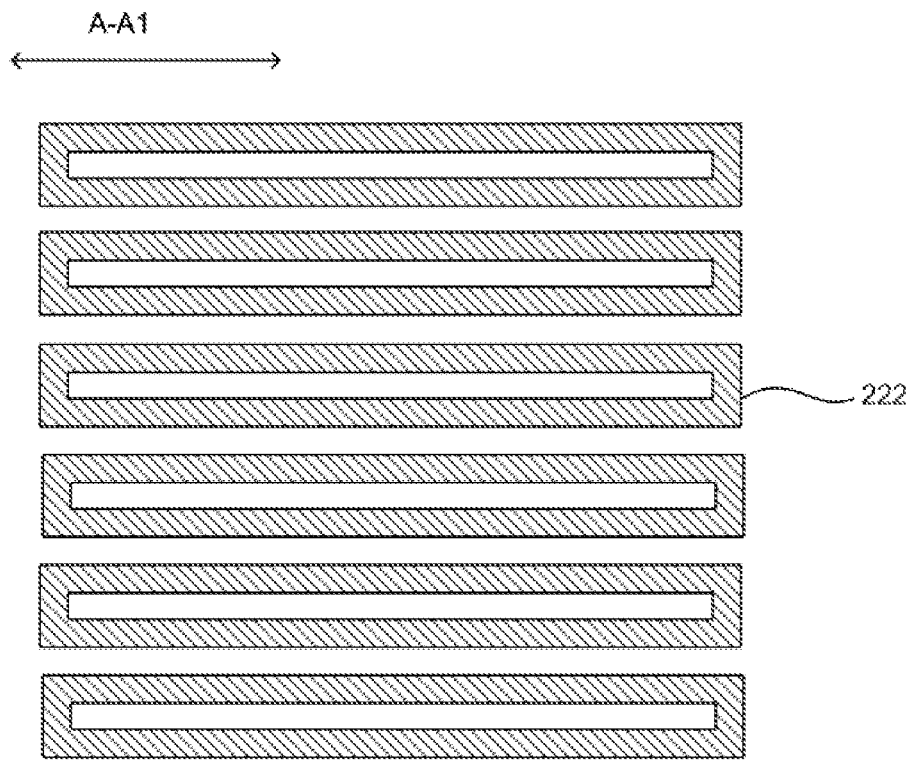

Referring to FIG. 5, the second patterns 222 may extend along the direction of A-A1, and the second patterns 222 may be rectangles. Because of the foregoing manufacturing steps, the edges of every two adjacent second patterns 222 may be connected. Because the edge portion eventually may be trimmed, the connection of the edges will not affect the formation of the array of discrete active areas.

The second mask layer 120 may include another material outside the second patterns 222 and serving as an isolating layer 223. The isolating layer 223 may be formed after the formation of the second patterns 222. The top surface of the isolating layer 223 may be flush with the top surface of the second patterns 222, and the isolating layer 223 may only fill the area outside the second patterns 222. Alternatively, the top surface of the isolating layer 223 may be higher than the top surface of the second patterns 222. In other words, the isolating layer 223 may fill the area between adjacent second patterns 222 and cover the surface of the second patterns 222. The etching selection ratio of the material of the isolating layer 223 to the second patterns 222 may be high enough under at least one etching or corrosive condition. The isolating layer 223 may include, but not limited to, photoresist, silicon dioxide, doped silicon dioxide, silicon nitride, silicon oxynitride, polycrystalline silicon, monocrystalline silicon, carbon.

Figure 6:
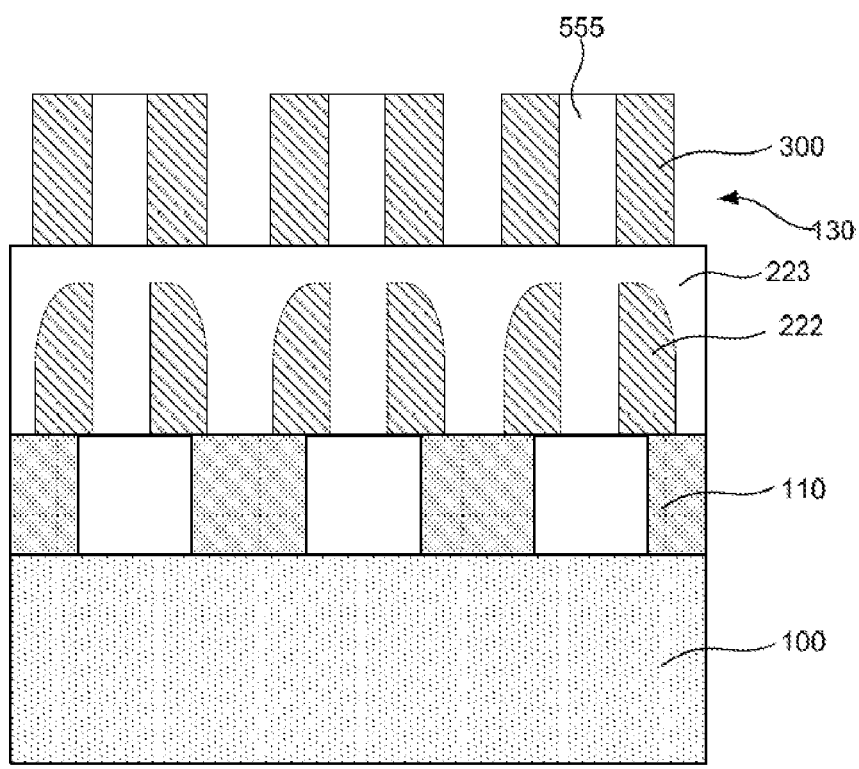

In the third step, referring to FIG. 6, a third mask layer 130 may be formed on the second mask layer 120. A plurality of strip-shaped third patterns 333 arranged in parallel may be formed in the third mask layer 130. The number of strip-shaped third patterns 333 may be determined according to actual needs and is not limited in this invention. When viewing along a top-to-bottom direction perpendicular to the top surface of the substrate 100, the second patterns 222 may overlap with the third patterns 333. That is, in a top view of the semiconductor structure, the second patterns 222 may overlap with the third patterns 333. The second patterns 222 and the third patterns 333 may be configured to sever the first patterns 111 at predetermined positions.

FIG. 14 is a schematic top view of the semiconductor structure in this embodiment. Referring to FIGS. 6 and 14, the third mask layer 130 may be formed on the second mask layer 120 by depositing a second sacrificial layer 220 on the surface of the second mask layer 120 through a deposition process. A plurality of strip-shaped fifth patterns 555 arranged in parallel may be formed in the second sacrificial layer 220, and a mask material 300 may be formed on the sidewall of the fifth patterns 555. The number of strip-shaped fifth patterns 555 may be determined according to actual needs and is not limited in this invention.

Figure 7:
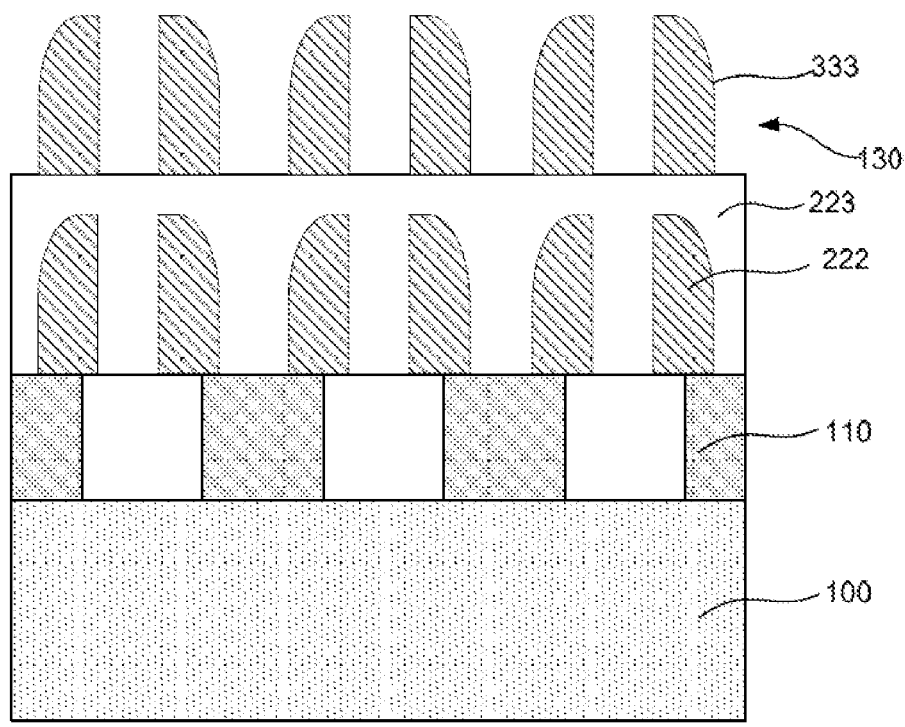

Referring to FIGS. 6, 7 and 14, the third mask layer 130 may be formed by removing the second sacrificial layer 220, while retaining the mask material on the sidewall of the fifth patterns 555. The plurality of strip-shaped third patterns 333 arranged in parallel may be formed in the third mask layer 130. The mask material on the sidewall in the third step may be the same as or different from the mask material on the sidewall in the second step, which is not limited herein.

Figure 8:
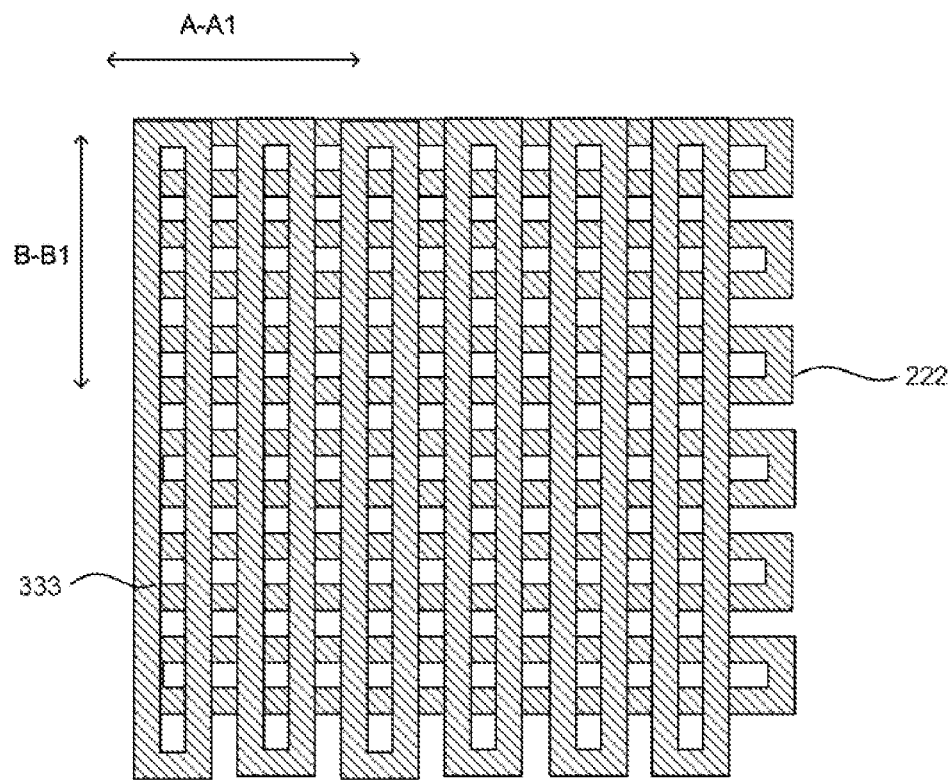
Figure 15:
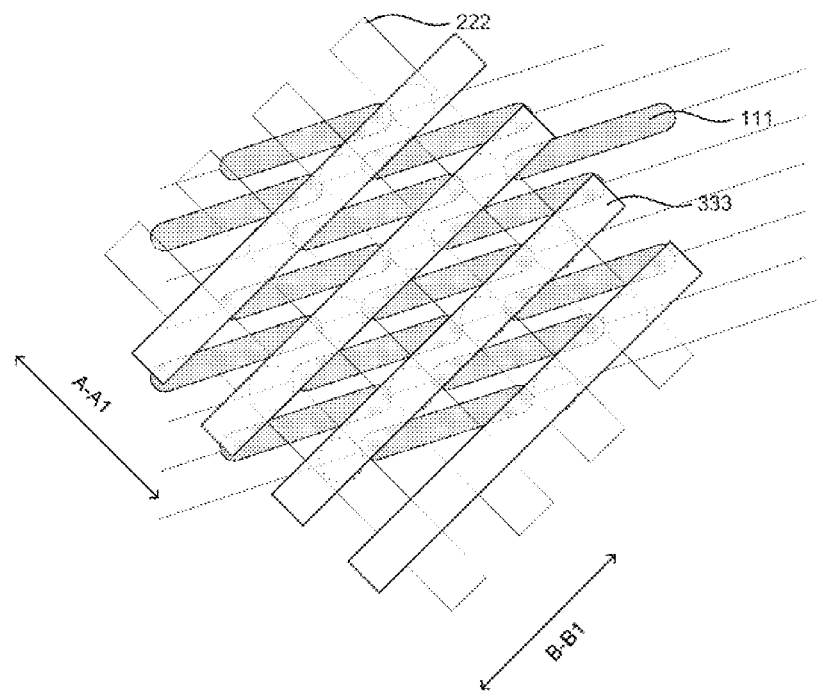

Referring to FIGS. 8 and 15, when viewing along a top-to-bottom direction perpendicular to the top surface of the substrate 100, the second patterns 222 may overlap with the third patterns 333. The second patterns 222 and the third patterns 333 may be configured to sever the first patterns 111 at predetermined positions. A-A1 may be an extension direction of the second patterns 222, and B-B1 may be an extension direction of the third patterns 333.

To properly arrange the subsequently formed discrete active areas and to increase the storage density of a dynamic random-access memory, the angle between the second patterns 222 and the first patterns 111 may be set to range from 65 degrees to 75 degrees, or from 68 degrees to 72 degrees, or be set to 70.15 degrees. The angle between the second patterns 222 and the third patterns 333 may be set to 90 degrees.

The distance between center lines of two adjacent fourth patterns 444 (i.e., the pitch of the fourth patterns 444) may be 4 to 5 times, or 4 to 4.5 times, or 4.35 times of the pitch of the first patterns 111 (i.e., the preset value ACT). The pitch of the fifth patterns 555 may be 4 to 5 times, or 4 to 4.5 times, or 4.35 times of the pitch of the first patterns 111 (i.e., the preset value ACT).

Figure 10:
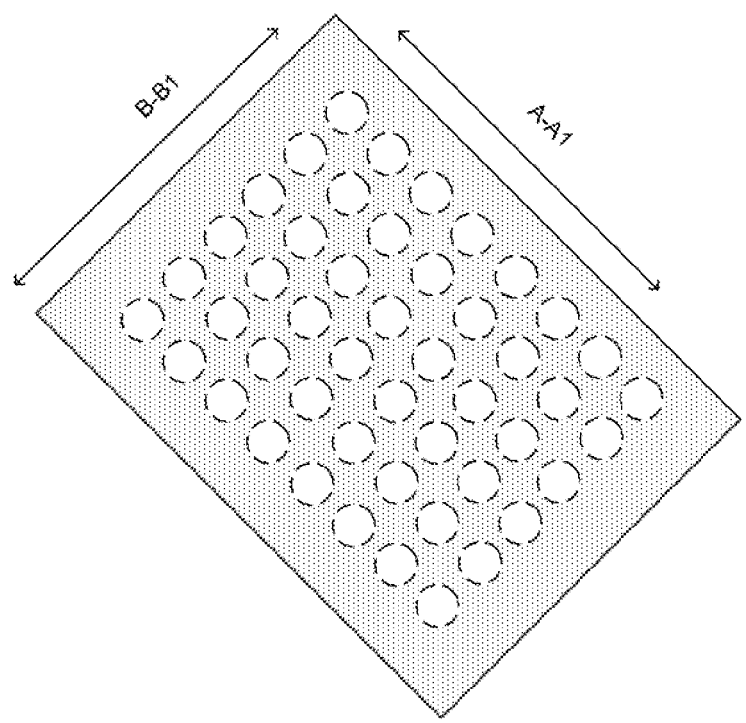

Further, referring to FIGS. 10 and 15, the second patterns 222 and the third patterns 333 may be configured to sever the first patterns 111 at predetermined positions based on the overlap area of the second patterns 222 and the third patterns 333.

Referring to FIGS. 10 and 15, the dashed circles represent the predetermined positions at which the first patterns 111 may be severed based on the overlap area of the second patterns 222 and the third patterns 333. Although the predetermined positions depicted in FIGS. 10 and 15 are represented by circles, the overlap area of the second patterns 222 and the third patterns 333 is not limited to circles and may be other shapes. In actual manufacturing processes, the overlap area may be a circle or other regular or irregular pattern, which is not limited in this invention.

Further, the substrate 100 may include an array area, and the first patterns 111, the second patterns 222, and the third patterns 333 may be all formed at least in the array area.

FIG. 15 is a schematic diagram illustrating the severance of the first patterns 111 based on the second patterns 222 and the third patterns 333 in an embodiment. However, the continuity of the strip-shaped first patterns 111 at the predetermined position may not be shown in FIG. 15.

Figure 18:
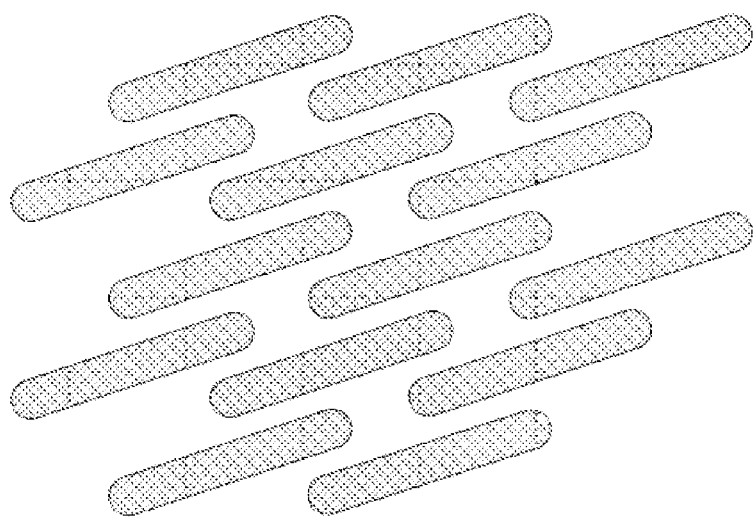

In the fourth step, referring to FIG. 18, layer-by-layer etching may be performed, using the first mask layer 110, the second mask layer 120, and the third mask layer 130 as masks, to transfer the first patterns 111, the second patterns 222, and the third patterns 333 to the substrate 100 to form an array of discrete active areas.

In the semiconductor structure manufacturing method disclosed herein, a plurality of mask layers may be formed on the surface of a semiconductor substrate based on photolithography patterns of large feature sizes. The patterns in the plurality of mask layers may be properly designed to obtain an array of discrete active areas of small feature sizes by using these mask layers. Therefore, the manufacturing difficulty may be reduced, and the production capacity and yield of semiconductor structures may be improved.

In this specification, the photolithography patterns of large feature sizes may be patterns with a relatively large dimension (i.e., pitch), and the photolithography patterns of small feature sizes may be patterns with a relatively small dimension (i.e., pitch). The photolithography patterns of large features size are easier to manufacture than the photolithography patterns of small feature sizes.

2. The Second Embodiment

This specification further presents a semiconductor structure manufacturing method as the second embodiment of the present invention.

Referring to FIG. 1, in the first step, a substrate 100 may be provided. A first mask layer 110 may be formed on the surface of the substrate 100. A plurality of strip-shaped first patterns 111 arranged in parallel may be formed in the first mask layer 110 and configured to form a plurality of strip-shaped continuous active areas arranged in parallel in the substrate 100. The number of strip-shaped first patterns 111 may be determined according to actual needs and is not limited in this invention.

FIG. 2 is a schematic top view illustrating the strip-shaped first patterns 111. Referring to FIG. 2, a plurality of strip-shaped first patterns 111 are schematically depicted to clearly show the structure. The first patterns 111 may be rectangles or curved irregular patterns. The distance between center lines of two adjacent first patterns 111 (i.e., the pitch of the first patterns 111) may be a preset value ACT.

The first patterns 111 may be formed through one photolithography process or by using an SADP technology. A person skilled in the art should understand that the first patterns 111 formed by using the SADP technology may be closed patterns, and every two adjacent first patterns 111 shown in FIG. 2 may be connected together at the upper and lower edges of the first patterns 111. Examples of the connections at the edges are shown at the left and right edges in FIG. 5.

In the second step, referring to FIG. 3, a second mask layer 120 may be formed on the first mask layer 110. A plurality of strip-shaped second patterns 222 arranged in parallel may be formed in the second mask layer 120. The number of strip-shaped second patterns 222 may be determined according to actual needs and is not limited in this invention.

The second mask layer 120 may be formed on the first mask layer 110 by depositing a first sacrificial layer 210 on the surface of the first mask layer 110 through a deposition process, as shown in FIG. 3.

Figure 11:
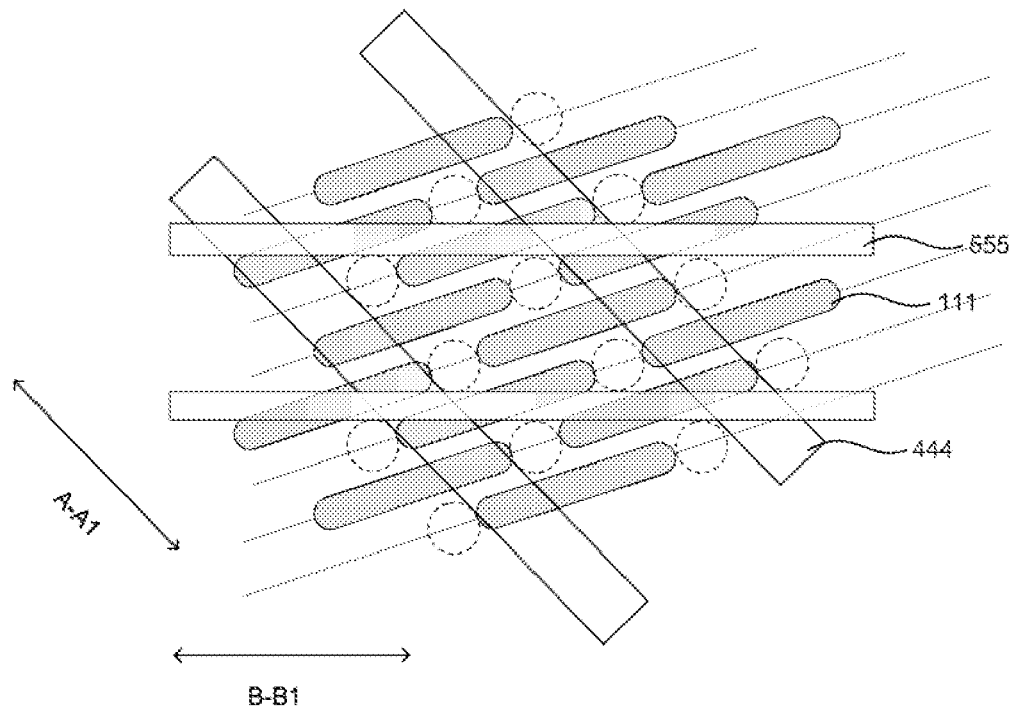
FIGS. 11, 12, 13, 14, 15, 16, 17 and 18 are schematic top views illustrating the semiconductor structures according to one or more embodiments of the present invention.

FIG. 11 is a schematic top view illustrating the semiconductor structure in this embodiment. Referring to FIGS. 3 and 11, a plurality of strip-shaped fourth patterns 444 arranged in parallel may be formed in the first sacrificial layer 210. The number of strip-shaped fourth patterns 444 may be determined according to actual needs and is not limited in this invention.

A mask material 300 may be formed on the sidewall of the fourth patterns 444. The mask material 300 may be directly formed on the sidewall of the fourth patterns 444. Alternatively, the mask material may be first deposited on the entire fourth patterns 444, and then be etched to retain only the mask material 300 on the sidewall of the fourth patterns 444.

Referring to FIG. 4, the plurality of strip-shaped second patterns 222 arranged in parallel in the second mask layer 120 may be formed by removing the first sacrificial layer 210, while retaining the mask material 300 on the sidewall of the fourth patterns 444. A schematic top view illustrating the second patterns 222 is shown in FIG. 5.

In the third step, a third mask layer 130 may be formed on the second mask layer 120. A plurality of strip-shaped third patterns 333 arranged in parallel may be formed in the third mask layer 130. The number of strip-shaped third patterns 333 may be determined according to actual needs and is not limited in this invention. When viewing along a top-to-bottom direction perpendicular to the top surface of the substrate 100, the second patterns 222 may overlap with the third patterns 333. The second patterns 222 and the third patterns 333 may be configured to sever the first patterns 111 at predetermined positions.

Figure 12:
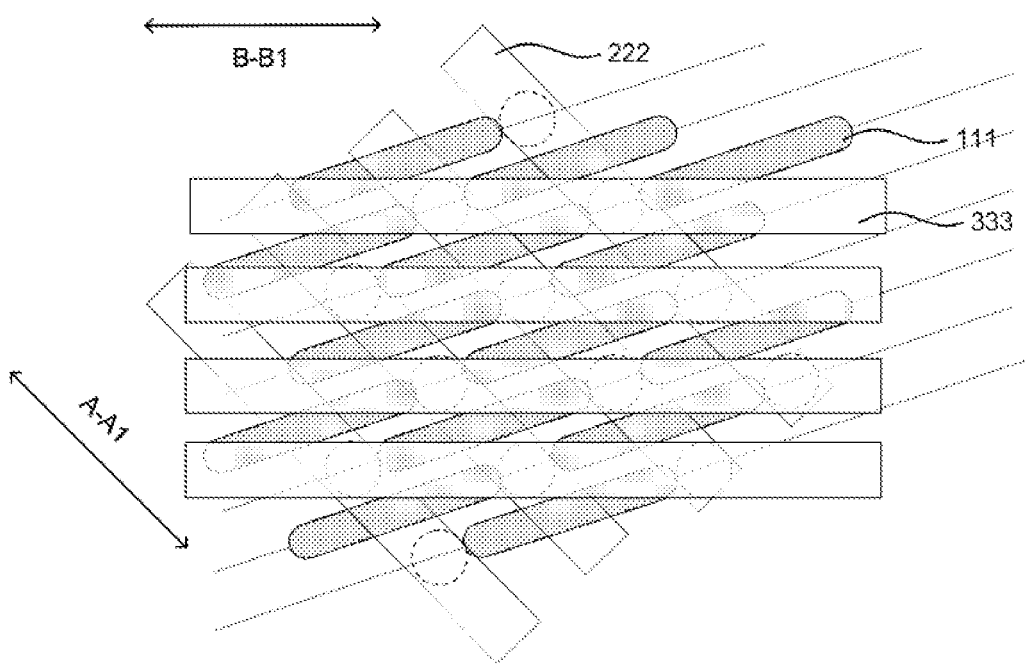

FIGS. 11 and 12 are schematic top views illustrating the semiconductor structure in this embodiment. Referring to FIGS. 6, 11, and 12, the third mask layer 130 may be formed on the second mask layer 120 by depositing a second sacrificial layer 220 on the surface of the second mask layer 120 through a deposition process. A plurality of strip-shaped fifth patterns 555 arranged in parallel may be formed in the second sacrificial layer 220, and a mask material 300 may be formed on the sidewall of the fifth patterns 555.

Referring to FIGS. 6, 7, and 12, the third mask layer 130 may be formed by removing the second sacrificial layer 220, while retaining the mask material on the sidewall of the fifth patterns 555. The plurality of strip-shaped third patterns 333 arranged in parallel may be formed in the third mask layer 130. The mask material on the sidewall in this third step may be the same as or different from the mask material on the sidewall in the second step in the previous embodiment, which is not limited herein.

Figure 9:
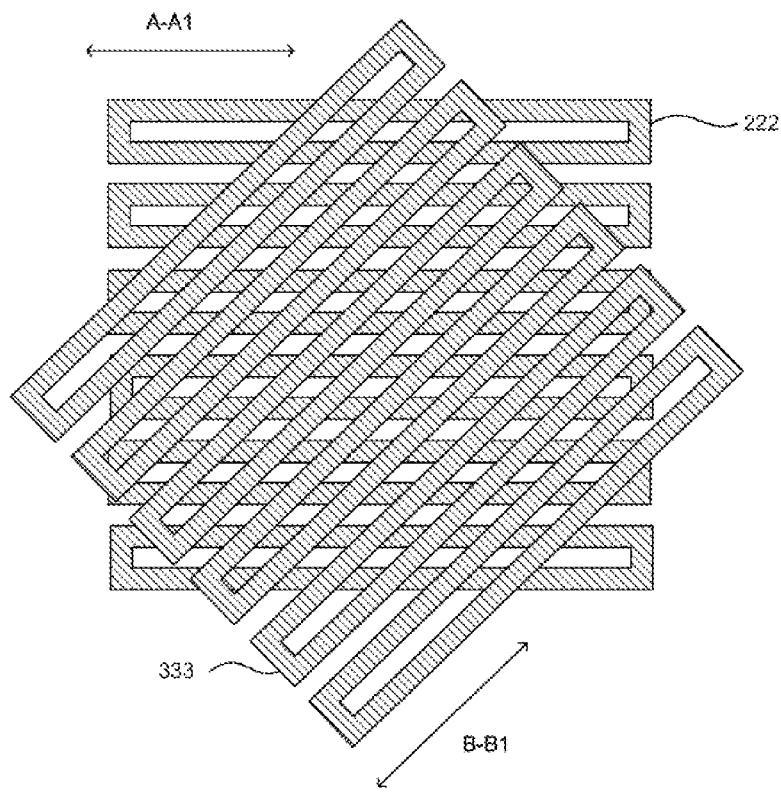

Referring to FIGS. 9 and 12, the second patterns 222 may overlap with the third patterns 333. The second patterns 222 and the third patterns 333 may be configured to sever the first patterns 111 at predetermined positions. A-A1 may be an extension direction of the second patterns 222, and B-B1 may be an extension direction of the third patterns 333.

To properly arrange the subsequently formed discrete active areas and to increase the storage density of a dynamic random-access memory, the angle between the second patterns 222 and the first patterns 111 may be set to range from 65 degrees to 75 degrees, or from 68 degrees to 72 degrees, or be set to 70.15 degrees. The angle between the second patterns 222 and the third patterns 333 may be set to range from 45 degrees to 55 degrees, or from 48 degrees to 52 degrees, or be set to 49.1 degrees.

The distance between center lines of two adjacent fourth patterns 444 (i.e., the pitch of the fourth patterns 444) may be 4 to 5 times, or 4 to 4.5 times, or 4.25 times of the pitch of the first patterns 111 (i.e., the preset value ACT). The pitch of the fifth patterns 555 may be 3 to 4 times, or 3 to 3.5 times, or 3.21 times of the pitch of the first patterns 111 (i.e., the preset value ACT).

Further, referring to FIGS. 10 and 12, the second patterns 222 and the third patterns 333 may be configured to sever the first patterns 111 at predetermined positions based on the overlap area of the second patterns 222 and the third patterns 333.

Referring to FIGS. 10 and 12, the dashed circles represent the predetermined positions at which the first patterns 111 may be severed based on the overlap area of the second patterns 222 and the third patterns 333. Although the predetermined positions depicted in FIGS. 10 and 12 are represented by circles, the overlap area of the second patterns 222 and the third patterns 333 is not limited to circles and may be other shapes. In the actual manufacturing processes, the overlap area may be a circle or other regular or irregular pattern, which is not limited in this invention.

Further, the substrate 100 may include an array area, and the first patterns 111, the second patterns 222, and the third patterns 333 may be all formed at least in the array area.

FIG. 12 is a schematic diagram illustrating the severance of the first patterns 111 based on the second patterns 222 and the third patterns 333 in an embodiment. However, the continuity of the strip-shaped first patterns 111 at the predetermined position may not be shown in FIG. 12.

The first through third steps in the second embodiment may be the same as the corresponding steps of the first embodiment. Therefore, the details of these steps are omitted herein for the sake of conciseness.

In the fourth step, layer-by-layer etching may be performed, using the first mask layer 110, the second mask layer 120, and the third mask layer 130 as masks, to transfer the first patterns 111, the second patterns 222, and the third patterns 333 to the substrate 100 to form an array of discrete active areas, as shown in FIG. 18.

The second embodiment differs from the first embodiment in that the angle between the second patterns 222 and the third patterns 333 is different. The angle may be set by a person skilled in the art based on actual needs, and this embodiment shall not be construed as a limitation.

In the second embodiment, a plurality of mask layers may be formed on the surface of a semiconductor substrate based on photolithography patterns of large feature sizes. The patterns in the plurality of mask layers may be properly designed to obtain an array of discrete active areas of small feature sizes by using these mask layers. Therefore, the manufacturing difficulty may be reduced, and the production capacity and yield of semiconductor structures may be improved. The large feature size and the small feature size have the same meanings as described foregoing.

3. The Third Embodiment

This specification further presents another semiconductor structure manufacturing method as the third embodiment of the present invention.

Referring to FIG. 1, in the first step, a substrate 100 may be provided. A first mask layer 110 may be formed on the surface of the substrate 100. A plurality of strip-shaped first patterns 111 arranged in parallel may be formed in the first mask layer 110 and configured to form a plurality of strip-shaped continuous active areas arranged in parallel in the substrate 100. The number of strip-shaped first patterns 111 may be determined according to actual needs and is not limited in this invention.

FIG. 2 is a schematic top view illustrating the strip-shaped first patterns 111. Referring to FIG. 2, a plurality of strip-shaped first patterns 111 are schematically depicted to clearly show the structure.

In the second step, referring to FIG. 3, a second mask layer 120 may be formed on the first mask layer 110. A plurality of strip-shaped second patterns 222 arranged in parallel may be formed in the second mask layer 120. The number of strip-shaped second patterns 222 may be determined according to actual needs and is not limited in this invention.

The second mask layer 120 may be formed on the first mask layer 110 by depositing a first sacrificial layer 210 on the surface of the first mask layer 110 through a deposition process, as shown in FIG. 3.

FIG. 14 is a schematic top view illustrating the semiconductor structure in this embodiment. Referring to FIGS. 3 and 14, a plurality of strip-shaped fourth patterns 444 arranged in parallel may be formed in the first sacrificial layer 210. The number of strip-shaped fourth patterns 444 may be determined according to actual needs and is not limited in this invention.

A mask material 300 may be formed on the sidewall of the fourth patterns 444. The mask material 300 may be directly formed on the sidewall of the fourth patterns 444. Alternatively, the mask material may be first deposited on the entire fourth patterns 444, and then be etched to retain only the mask material 300 on the sidewall of the fourth patterns 444.

Referring to FIG. 4, the plurality of strip-shaped second patterns 222 arranged in parallel in the second mask layer 120 may be formed by removing the first sacrificial layer 210, while retaining the mask material 300 on the sidewall of the fourth patterns 444. A schematic top view illustrating the second patterns 222 is shown in FIG. 5.

In the third step, a third mask layer 130 may be formed on the second mask layer 120. A plurality of strip-shaped third patterns 333 arranged in parallel may be formed in the third mask layer 130. The second patterns 222 may overlap with the third patterns 333. The second patterns 222 and the third patterns 333 may be configured to sever the first patterns 111 at predetermined positions.

FIG. 14 is a schematic top view illustrating the semiconductor structure in this embodiment. Referring to FIGS. 6 and 14, the third mask layer 130 may be formed on the second mask layer 120 by depositing a second sacrificial layer 220 on the surface of the second mask layer 120 through a deposition process. A plurality of strip-shaped fifth patterns 555 arranged in parallel may be formed in the second sacrificial layer 220, and a mask material 300 may be formed on the sidewall of the fifth patterns 555.

Referring to FIGS. 6, 7, and 14, the third mask layer 130 may be formed by removing the second sacrificial layer 220, while the mask material on the sidewall of the fifth patterns 555 may be retained. The plurality of strip-shaped third patterns 333 arranged in parallel may be formed in the third mask layer 130. The mask material on the sidewall in the third step may be the same as or different from the mask material on the sidewall in the second step in the previous embodiment, which is not limited herein.

Referring to FIG. 8, when viewing along a top-to-bottom direction perpendicular to the top surface of the substrate 100, the second patterns 222 may overlap with the third patterns 333. The second patterns 222 and the third patterns 333 may be configured to sever the first patterns 111 at predetermined positions. A-A1 may be an extension direction of the second patterns 222, and B-B1 may be an extension direction of the third patterns 333.

To properly arrange the subsequently formed discrete active areas and to increase the storage density of a dynamic random-access memory, the angle between the second patterns 222 and the first patterns 111 may be set to range from 65 degrees to 75 degrees, or from 68 degrees to 72 degrees, or be set to 70.15 degrees. The angle between the second patterns 222 and the third patterns 333 may be set to 90 degrees. The pitch of the fourth patterns 444 may be 4 to 5 times, or 4 to 4.5 times, or 4.25 times of the pitch of the first patterns 111 (i.e., the preset value ACT). The pitch of the fifth patterns 555 may be 4 to 5 times, or 4 to 4.5 times, or 4.25 times of the pitch of the first patterns 111 (i.e., the preset value ACT).

Figure 16:
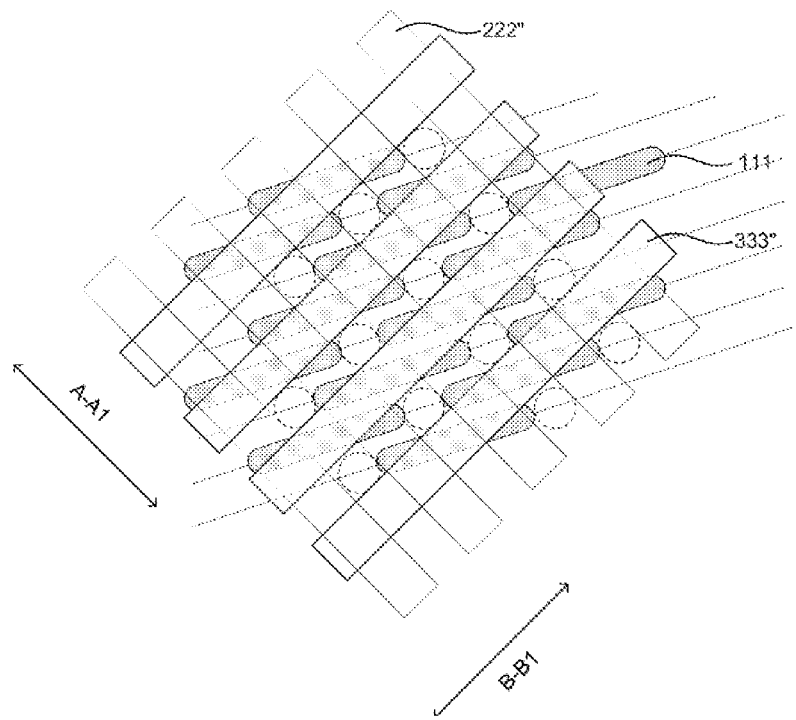

Further, referring to FIG. 16, the second patterns 222 and the third patterns 333 may be configured to sever the first patterns 111 at predetermined positions by: forming a second complementary mask layer (not shown in the drawings) based on the second patterns 222 on the second mask layer 120, the second complementary mask layer having the second complementary patterns 222" covering the area outside the second patterns 222; forming a third complementary mask layer (not shown in the drawings) based on the third patterns 333 on the third mask layer 130, the third complementary mask layer having the third complementary patterns 333" covering the area outside the third patterns 333; and severing the first patterns 111 based on the non-overlapping area of the second complementary patterns 222" and the third complementary patterns 333".

Referring to FIGS. 10 and 16, the dashed circles represent the predetermined positions at which the first patterns 111 may be severed based on the non-overlapping area of the second complementary patterns 222" and the third complementary patterns 333". Although the predetermined positions depicted in FIGS. 10 and 16 are represented by circles, the non-overlapping area of the second complementary patterns 222" and the third complementary patterns 333" is not limited to circles and may be other shapes. In actual manufacturing processes, the non-overlapping area may be a circle or other regular or irregular pattern, which is not limited in this invention.

Further, the substrate 100 may include an array area, and the first patterns 111, the second complementary patterns 222", and the third complementary patterns 333" may be all formed at least in the array area.

FIG. 16 is a schematic diagram illustrating the severance of the first patterns 111 based on the second patterns 222 and the third patterns 333 in an embodiment. However, the continuity of strip-shaped first patterns 111 at the predetermined position may not be shown in FIG. 16.

The first through third steps in this third embodiment may be the same as the corresponding steps in the foregoing embodiments. Therefore, the details of these steps are omitted herein for the sake of conciseness.

In the fourth step, layer-by-layer etching may be performed, using the first mask layer 110, the second mask layer 120, and the third mask layer 130 as masks, to transfer the first patterns 111, the second complementary patterns 222", and the third complementary patterns 333" to the substrate 100 to form an array of discrete active areas, as shown in FIG. 18.

The third embodiment differs from the first embodiment in that, in the third embodiment, the first patterns 111 may be severed based on the non-overlapping area of the second complementary patterns 222" and the third complementary patterns 333". The non-overlapping area may be set by a person skilled in the art based on actual needs, and this embodiment shall not be construed as a limitation.

In this embodiment, a plurality of mask layers may be formed on the surface of a semiconductor substrate based on photolithography patterns of large feature sizes. The patterns in the plurality of mask layers may be properly designed to obtain an array of discrete active areas of small feature sizes by using these mask layers. Therefore, the manufacturing difficulty may be reduced, and the production capacity and yield of semiconductor structures may be improved.

4. The Fourth Embodiment

This specification further presents another semiconductor structure manufacturing method as the fourth embodiment of the present invention.

Referring to FIG. 1, in the first step, a substrate 100 may be provided. A first mask layer 110 may be formed on the surface of the substrate 100. A plurality of strip-shaped first patterns 111 arranged in parallel may be formed in the first mask layer 110 and configured to form a plurality of strip-shaped continuous active areas arranged in parallel in the substrate 100. The number of strip-shaped first patterns 111 may be determined according to actual needs and is not limited in this invention.

FIG. 2 is a schematic top view illustrating the strip-shaped first patterns 111. Referring to FIG. 2, a plurality of strip-shaped first patterns 111 are schematically depicted to clearly show the structure. The first patterns 111 may be rectangles or curved irregular patterns. The pitch of the first patterns 111 may be a preset value ACT.

The first patterns 111 may be formed through one photolithography process or by using an SADP technology. A person skilled in the art should understand that the first patterns 111 formed by using the SADP technology may be closed patterns, and every two adjacent first patterns 111 shown in FIG. 2 may be connected together at the upper and lower edges of the first patterns 111. Examples of the connections at the edges are shown at the left and right edges in FIG. 5.

In the second step, referring to FIG. 3, a second mask layer 120 may be formed on the first mask layer 110. A plurality of strip-shaped second patterns 222 arranged in parallel may be formed in the second mask layer 120. The number of strip-shaped second patterns 222 may be determined according to actual needs and is not limited in this invention.

The second mask layer 120 may be formed on the first mask layer 110 by depositing a first sacrificial layer 210 on the surface of the first mask layer 110 through a deposition process, as shown in FIG. 3.

FIG. 11 is a schematic top view illustrating the semiconductor structure in this embodiment. Referring to FIGS. 3 and 11, a plurality of strip-shaped fourth patterns 444 arranged in parallel may be formed in the first sacrificial layer 210. The number of strip-shaped fourth patterns 444 may be determined according to actual needs and is not limited in this invention.

A mask material 300 may be formed on the sidewall of the fourth patterns 444. The mask material 300 may be directly formed on the sidewall of the fourth patterns 444. Alternatively, the mask material may be first deposited on the entire fourth patterns 444, and then be etched to retain only the mask material 300 on the sidewall of the fourth patterns 444.

Referring to FIG. 4, the plurality of strip-shaped second patterns 222 arranged in parallel in the second mask layer 120 may be formed by removing the first sacrificial layer 210 while retaining the mask material 300 on the sidewall of the fourth patterns 444. A schematic top view illustrating the second patterns 222 is shown in FIG. 5.

In the third step, a third mask layer 130 may be formed on the second mask layer 120. A plurality of strip-shaped third patterns 333 arranged in parallel may be formed in the third mask layer 130. When viewing along a top-to-bottom direction perpendicular to the top surface of the substrate 100, the second patterns 222 may overlap with the third patterns 333. The second patterns 222 and the third patterns 333 may be configured to sever the first patterns 111 at predetermined positions.

FIGS. 11 and 12 are schematic top views illustrating the semiconductor structure in this embodiment. Referring to FIGS. 6, 11, and 12, the third mask layer 130 may be formed on the second mask layer 120 by depositing a second sacrificial layer 220 on the surface of the second mask layer 120 through a deposition process. A plurality of strip-shaped fifth patterns 555 arranged in parallel may be formed in the second sacrificial layer 220, and a mask material 300 may be formed on the sidewall of the fifth patterns 555. The number of strip-shaped fifth patterns 555 may be determined according to actual needs and is not limited in this invention.

Referring to FIGS. 6, 7 and 12, the third mask layer 130 may be formed by removing the second sacrificial layer 220, while retaining the mask material on the sidewall of the fifth patterns 555. The plurality of strip-shaped third patterns 333 arranged in parallel may be formed in the third mask layer 130. The mask material on the sidewall in the third step may be the same as or different from the mask material on the sidewall in the second step in the previous embodiments, which is not limited herein.

Referring to FIG. 9, the second patterns 222 may overlap with the third patterns 333, and the second patterns 222 and the third patterns 333 may be configured to sever the first patterns 111 at predetermined positions. A-A1 may be an extension direction of the second patterns 222, and B-B1 may be an extension direction of the third patterns 333.

To properly arrange the subsequently formed discrete active areas and increase the storage density of a dynamic random-access memory, the angle between the second patterns 222 and the first patterns 111 may be set to range from 65 degrees to 75 degrees, or from 68 degrees to 72 degrees, or be set to 70.15 degrees. The angle between the second patterns 222 and the third patterns 333 may be set to range from 45 degrees to 55 degrees, or from 48 degrees to 52 degrees, or be set to 49.1 degrees.

The pitch of the fourth patterns 444 may be 4 to 5 times, or 4 to 4.5 times, or 4.25 times of the pitch of the first patterns 111 (i.e., the preset value ACT). The pitch of the fifth patterns 555 may be 3 to 4 times, or 3 to 3.5 times, or 3.21 times of the pitch of the first patterns 111 (i.e., the preset value ACT).

Figure 13:
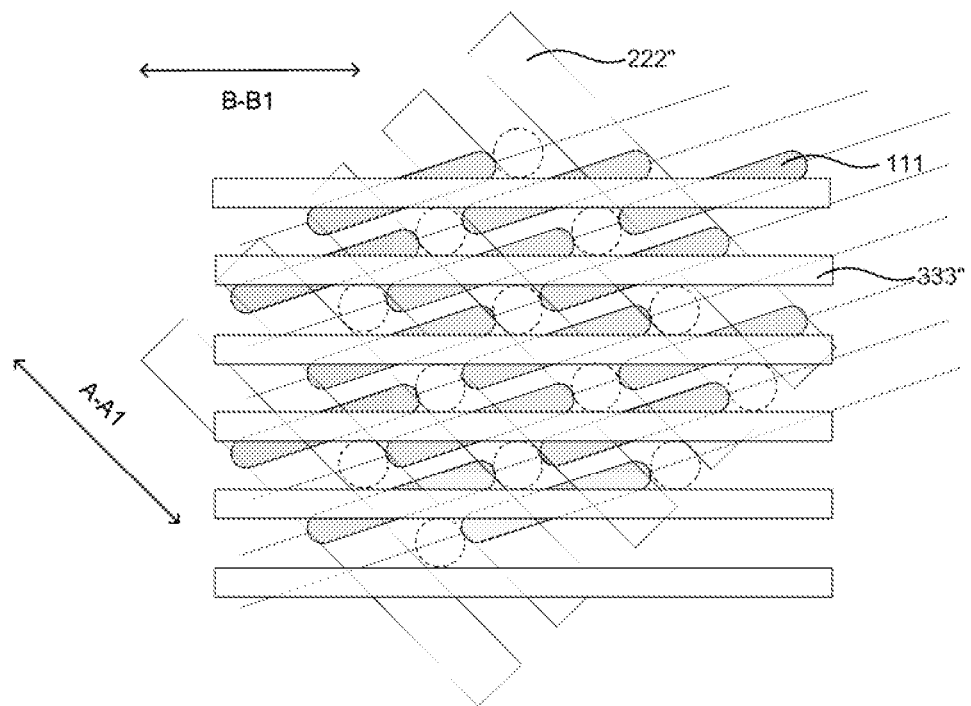

Further, referring to FIG. 13, the second patterns 222 and the third patterns 333 may be configured to sever the first patterns 111 at predetermined positions by: forming a second complementary mask layer (not shown in the drawing) based on the second patterns 222 on the second mask layer 120, the second complementary mask layer having the second complementary patterns 222" covering the area outside the second patterns 222; forming a third complementary mask layer (not shown in the drawings) based on the third patterns 333 on the third mask layer 130, the third complementary mask layer having the third complementary patterns 333" covering the area outside the third patterns 333; and severing the first patterns 111 based on the non-overlapping area of the second complementary patterns 222" and the third complementary patterns 333".

Referring to FIGS. 10 and 13, the dashed circles represent the predetermined positions at which the first patterns 111 may be severed based on the non-overlapping area of the second complementary patterns 222" and the third complementary patterns 333". Although the predetermined positions depicted in FIGS. 10 and 13 are represented by circles, the non-overlapping area of the second complementary patterns 222" and the third complementary patterns 333" is not limited to circles and may be other shapes. In actual manufacturing processes, the non-overlapping area may be a circle or other regular or irregular pattern, which is not limited in this invention.

Further, the substrate 100 may include an array area, and the first patterns 111, the second complementary patterns 222", and the third complementary patterns 333" may be all formed at least in the array area.

The first through third steps in the fourth embodiment may be the same as the corresponding steps in the foregoing embodiments. Therefore, the details of the same steps are omitted herein for the sake of conciseness.

In the fourth step, layer-by-layer etching may be performed, using the first mask layer 110, the second mask layer 120, and the third mask layer 130 as masks, to transfer the first patterns 111, the second complementary patterns 222", and the third complementary patterns 333" to the substrate 100 to form an array of discrete active areas, as shown in FIG. 18.

The fourth embodiment differs from the first embodiment in that the angle between the second patterns 222 and the third patterns 333 is different, and the first patterns 111 may be severed by using the non-overlapping area of the second complementary patterns 222" and the third complementary patterns 333", which may be set based on actual needs, and this embodiment shall not be construed as a limitation.

In this embodiment, a plurality of mask layers may be formed on the surface of a semiconductor substrate based on photolithography patterns of large feature sizes. The patterns in the plurality of mask layers may be properly designed to obtain an array of discrete active areas of small feature sizes by using these mask layers. Therefore, the manufacturing difficulty may be reduced, and the production capacity and yield of semiconductor structures may be improved.

5. The Fifth Embodiment

This specification further presents another semiconductor structure manufacturing method as the fifth embodiment of the present invention.

In the first step, referring to FIG. 1, a substrate 100 may be provided. A first mask layer 110 may be formed on the surface of the substrate 100. A plurality of strip-shaped first patterns 111 arranged in parallel may be formed in the first mask layer 110 and configured to form a plurality of strip-shaped continuous active areas arranged in parallel in the substrate 100. The number of strip-shaped first patterns 111 may be determined according to actual needs and is not limited in this invention.

FIG. 2 is a schematic top view illustrating the strip-shaped first patterns 111. Referring to FIG. 2, a plurality of strip-shaped first patterns 111 are schematically depicted to clearly show the structure. The first patterns 111 may be rectangles or curved irregular patterns. The pitch of the first patterns 111 may be a preset value ACT.

The first patterns 111 may be formed through one photolithography process or by using an SADP technology. A person skilled in the art should understand that the first patterns 111 formed by using the SADP technology may be closed patterns, and every two adjacent first patterns 111 shown in FIG. 2 may be connected together at the upper and lower edges of the first patterns 111. Examples of the connections at the edges are shown at the left and right edges in FIG. 5.

In the second step, a second mask layer 120 may be formed on the first mask layer 110. A plurality of strip-shaped second patterns 222 arranged in parallel may be formed in the second mask layer 120. The number of strip-shaped second patterns 222 may be determined according to actual needs and is not limited in this invention.

The second mask layer 120 may be formed on the first mask layer 110 by depositing a first sacrificial layer 210 on the surface of the first mask layer 110 through a deposition process, as shown in FIG. 3.

FIG. 11 is a schematic top view illustrating the semiconductor structure in this embodiment. Referring to FIGS. 3 and 11, a plurality of strip-shaped fourth patterns 444 arranged in parallel may be formed in the first sacrificial layer 210. The number of strip-shaped fourth patterns 444 may be determined according to actual needs and is not limited in this invention.

A mask material 300 may be formed on the sidewall of the fourth patterns 444. The mask material 300 may be directly formed on the sidewall of the fourth patterns 444. Alternatively, the mask material may be first deposited on the entire fourth patterns 444, and then be etched to retain only the mask material 300 on the sidewall of the fourth patterns 444.

Referring to FIG. 4, the plurality of strip-shaped second patterns 222 arranged in parallel in the second mask layer 120 may be formed by removing the first sacrificial layer 210 while retaining the mask material 300 on the sidewall of the fourth patterns 444. A schematic top view illustrating the second patterns 222 is shown in FIG. 5.

In the third step, a third mask layer 130 may be formed on the second mask layer 120. A plurality of strip-shaped third patterns 333 arranged in parallel may be formed in the third mask layer 130. The number of strip-shaped third patterns 333 may be determined according to actual needs and is not limited in this invention. When viewing along a top-to-bottom direction perpendicular to the top surface of the substrate 100, the second patterns 222 may overlap with the third patterns 333. The second patterns 222 and the third patterns 333 may be configured to sever the first patterns 111 at predetermined positions.

FIGS. 11 and 12 are schematic top views illustrating the semiconductor structure in this embodiment. Referring to FIGS. 6, 11 and 12, the third mask layer 130 may be formed on the second mask layer 120 by depositing a second sacrificial layer 220 on the surface of the second mask layer 120 through a deposition process. A plurality of strip-shaped fifth patterns 555 arranged in parallel may be formed in the second sacrificial layer 220, and a mask material 300 may be formed on the sidewall of the fifth patterns 555. The number of strip-shaped fifth patterns 555 may be determined according to actual needs and is not limited in this invention.

Referring to FIGS. 6, 7 and 12, the third mask layer 130 may be formed by removing the second sacrificial layer 220 while retaining the mask material on the sidewall of the fifth patterns 555. The plurality of strip-shaped third patterns 333 arranged in parallel may be formed in the third mask layer 130. The mask material on the sidewall in the third step may be the same as or different from the mask material on the sidewall in the second step in the previous embodiments, which is not limited herein.

Referring to FIG. 9, the second patterns 222 may overlap with the third patterns 333, and the second patterns 222 and the third patterns 333 may be configured to sever the first patterns 111 at predetermined positions. A-A1 may be an extension direction of the second patterns 222, and B-B1 may be an extension direction of the third patterns 333.

To properly arrange the subsequently formed discrete active areas and to increase the storage density of a dynamic random-access memory, the angle between the second patterns 222 and the first patterns 111 may be set to range from 65 degrees to 75 degrees, or from 68 degrees to 72 degrees, or be set to 70.15 degrees. The angle between the second patterns 222 and the third patterns 333 may be set to range from 45 degrees to 55 degrees, or from 48 degrees to 52 degrees, or be set to 49.1 degrees.

The pitch of the fourth patterns 444 may be 4 to 5 times, or 4 to 4.5 times, or 4.25 times of the pitch of the first patterns 111 (i.e., the preset value ACT). The pitch of the fifth patterns 555 may be 3 to 4 times, or 3 to 3.5 times, or 3.21 times of the pitch of the first patterns 111 (i.e., the preset value ACT).

Further, the second patterns 222 and the third patterns 333 may be configured to sever the first patterns 111 at predetermined positions based on the overlap area of the second patterns 222 and the third patterns 333.

Referring to FIGS. 10 and 12, the dashed circles represent the predetermined positions at which the first patterns 111 may be severed based on the overlap area of the second patterns 222 and the third patterns 333. Although the predetermined positions depicted in FIGS. 10 and 12 are represented by circles, the overlap area of the second patterns 222 and the third patterns 333 is not limited to circles and may be other shapes. In actual manufacturing processes, the overlap area may be a circle or other regular or irregular pattern, which is not limited in this invention.

Further, the substrate 100 may include an array area, and the first patterns 111, the second patterns 222, and the third patterns 333 may be all formed at least in the array area.

The first through third steps in the fifth embodiments may be the same as the corresponding steps in the foregoing embodiments. Therefore, the details of these steps are omitted herein for the sake of conciseness.

Figure 17:
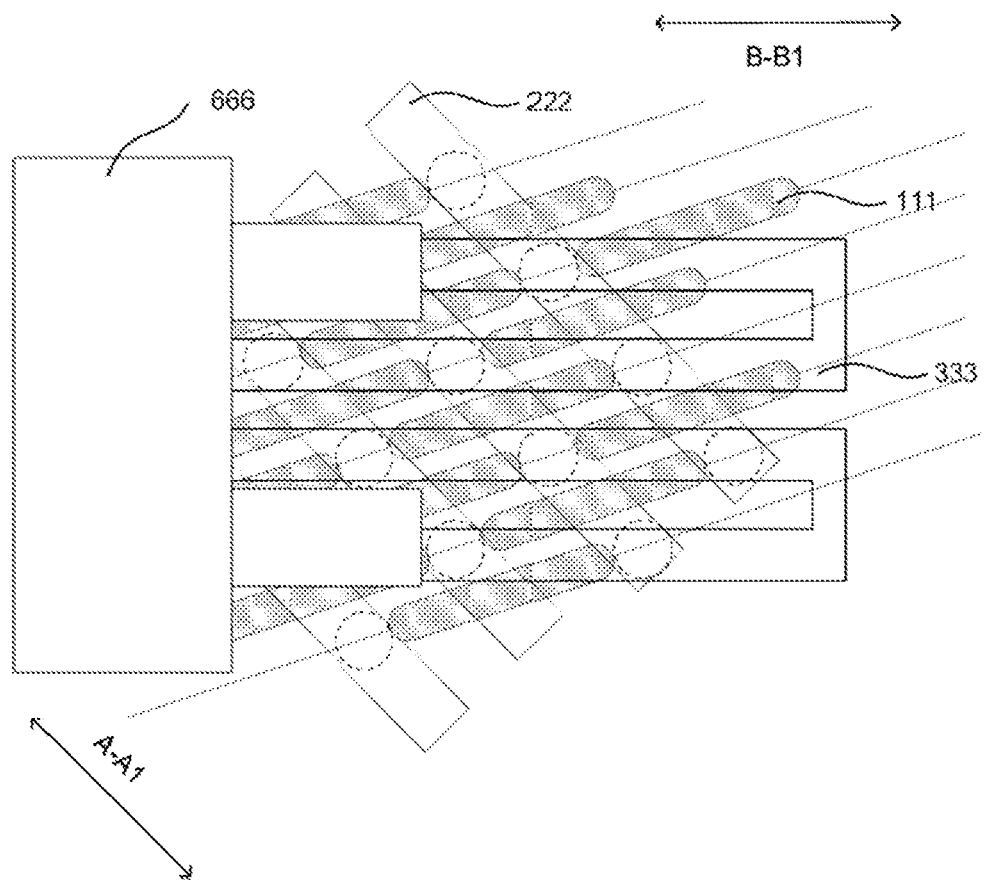

In the fourth step, referring to FIG. 17, a fourth mask layer may be formed on the third mask layer. The fourth mask layer may have sixth patterns 666 covering at least a portion of the second patterns 222 and at least a portion of the third patterns 333 at the edge of the array area.

In the fifth step, the sixth patterns 666 may further cover at least a sub-active area (not shown in the drawings) at the end of a continuous active area at the edge of the array area. The sub-active area may have a length less than that of a discrete active area. The first mask layer 110, the second mask layer 120, the third mask layer 130, and the fourth mask layer may be used as masks to transfer the first patterns 111, the second patterns 222, the third patterns 333, and the sixth patterns 666 to the substrate to form the array of discrete active areas, and there may be no sub-active area at the edge of the array area, as shown in FIG. 18.

The fifth embodiment differs from the foregoing embodiments in that the fourth mask layer is added to trim incomplete discrete active areas at the edge of the array area, to alleviate manufacturing issues that may be caused by defective active areas at the edge. Although the first mask layer, the second mask layer, and the third mask layer in this embodiment are the same as those in the foregoing embodiments, a person skilled in the art should understand that the fourth mask layer added in this embodiment may be applied to all of the first embodiment, the second embodiment, the third embodiment, and the fourth embodiment. The details of the same steps are omitted for simplicity. A person skilled in the art may choose, according to actual needs, whether to trim active areas at the edge of the array area after the array of discrete active areas are formed.

In the fifth embodiment, defective active areas in the array area may be trimmed to further improve the reliability and the performance of the semiconductor structure and to improve the yield.

The second embodiment, the third embodiment, the fourth embodiment, and the fifth embodiment of the present invention are described relatively briefly as they share some common contents with the first embodiment. Relevant descriptions in the first embodiments may be referred to for details.

This specification further presents a semiconductor structure.

Referring to FIG. 18, the semiconductor structure may include a substrate and discrete active areas.

An array of discrete active areas may be formed in the substrate. The array of discrete active areas may be formed using any one of the foregoing embodiments of the semiconductor structure manufacturing method. The number of discrete active areas may be determined according to actual needs and is not limited in this invention.

In this embodiment, a plurality of mask layers may be formed on the surface of the semiconductor substrate. The patterns in the plurality of mask layers may be properly designed to obtain an array of discrete active areas of small feature sizes by using these mask layers.

Referring to FIG. 18, a plurality of strip-shaped active areas arranged in parallel may be severed to form discrete active areas. Referring to FIG. 10, the dashed circles represent the predetermined positions at which the first patterns may be severed based on the overlap area of the second patterns and the third patterns. Although the predetermined positions depicted in FIG. 10 are represented by circles, the overlap area of the second patterns and the third patterns is not limited to circles and may be other shapes. In actual manufacturing processes, the overlap area may be a circle or other regular or irregular pattern, which is not limited in this invention.

The previous descriptions are some embodiments of the present invention. A person of ordinary skills in the art can make improvements or refinements without departing from the principle of the present invention. The improvements and refinements shall be regarded as falling within the protection scope of the present invention.

What is claimed is:

1. A semiconductor structure manufacturing method, comprising:
    providing a substrate;
    forming a first mask layer on the substrate, the first mask layer having a plurality of strip-shaped first patterns arranged in parallel and configured to form a plurality of strip-shaped continuous active areas arranged in parallel in the substrate;
    forming a second mask layer on the first mask layer, the second mask layer having a plurality of strip-shaped second patterns arranged in parallel;
    forming a third mask layer on the second mask layer, the third mask layer having a plurality of strip-shaped third patterns arranged in parallel and overlapping the second patterns, wherein the second patterns and the third patterns are configured to sever the first patterns at predetermined positions;
    performing layer-by-layer etching, using the first mask layer, the second mask layer, and the third mask layer as masks, to transfer the first patterns, the second patterns, and the third patterns to the substrate to form an array of discrete active areas, wherein the substrate comprises an array area, and the first patterns, the second patterns, and the third patterns are all formed at least in the array area; and
    forming a fourth mask layer on the third mask layer, the fourth mask layer having sixth patterns covering at least a portion of the second patterns and at least a portion of the third patterns at an edge portion of the array area, wherein the fourth mask layer is not extended to a portion of the array area other than the edge portion.

2. The semiconductor structure manufacturing method of claim 1, wherein the sixth patterns further cover a sub-active area at an end of the continuous active area at the edge of the array area, the sub-active area having a length less than that of the discrete active area, and wherein performing layer-by-layer etching to transfer the first patterns, the second patterns, and the third patterns to the substrate to form an array of discrete active areas comprises:
    transferring, using the first mask layer, the second mask layer, the third mask layer, and the fourth mask layer as masks, the first patterns, the second patterns, the third patterns, and the sixth patterns to the substrate to form the array of the discrete active areas, wherein there is no sub-active area at the edge of the array area.

3. The semiconductor structure manufacturing method of claim 1, wherein the first patterns are formed by using a self-aligned double patterning technology.

4. The semiconductor structure manufacturing method of claim 1, wherein the array area is a storage array area of a dynamic random-access memory.

5. The semiconductor structure manufacturing method of claim 1, wherein the first mask layer, the second mask layer, and the third mask layer are made of at least one of silicon dioxide, silicon nitride, silicon oxynitride, polycrystalline silicon, monocrystalline silicon, and carbon.

6. The semiconductor structure manufacturing method of claim 1, wherein forming a second mask layer on the first mask layer comprises:
    forming a first sacrificial layer on the first mask layer, the first sacrificial layer having a plurality of strip-shaped fourth patterns arranged in parallel;
    forming a mask material on a sidewall of the fourth patterns; and
    removing the first sacrificial layer while retaining the mask material on the sidewall of the fourth patterns to form the second mask layer.

7. The semiconductor structure manufacturing method of claim 6, wherein forming a third mask layer on the second mask layer comprises:
    forming a second sacrificial layer on the second mask layer, the second mask layer having a plurality of strip-shaped fifth patterns arranged in parallel;
    forming the mask material on a sidewall of the fifth patterns; and
    removing the second sacrificial layer while retaining the mask material on the sidewall of the fifth patterns to form the third mask layer.

8. The semiconductor structure manufacturing method of claim 7, wherein an angle between the second patterns and the first patterns is in a range of 65 degrees to 75 degrees.

9. The semiconductor structure manufacturing method of claim 8, wherein an angle between the second patterns and the third patterns is in a range of 45 degrees to 55 degrees.

10. The semiconductor structure manufacturing method of claim 9, wherein a pitch of the fourth patterns is 4 to 5 times of a pitch of the first patterns, and a pitch of the fifth patterns is 3 to 4 times of the pitch of the first patterns.

11. The semiconductor structure manufacturing method of claim 8, wherein an angle between the second patterns and the third patterns is 90 degrees.

12. The semiconductor structure manufacturing method of claim 11, wherein a pitch of the fourth patterns is 4 to 5 times of a pitch of the first patterns, and a pitch of the fifth patterns is 4 to 5 times of the pitch of the first patterns.

* * * * *